(12) United States Patent
Hu et al.

(10) Patent No.: US 12,034,038 B2
(45) Date of Patent: Jul. 9, 2024

(54) METHOD FOR MANUFACTURING CAPACITOR STRUCTURE

(71) Applicant: UNITED MICROELECTRONICS CORP., Hsinchu (TW)

(72) Inventors: Teng-Chuan Hu, Tainan (TW); Chu-Fu Lin, Kaohsiung (TW); Chun-Hung Chen, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 18/119,043

(22) Filed: Mar. 8, 2023

(65) Prior Publication Data

US 2023/0223431 A1    Jul. 13, 2023

Related U.S. Application Data

(62) Division of application No. 17/136,075, filed on Dec. 29, 2020, now Pat. No. 11,646,343.

(51) Int. Cl.
*H01L 21/02* (2006.01)
*H01L 49/02* (2006.01)

(52) U.S. Cl.
CPC .................................... *H01L 28/91* (2013.01)

(58) Field of Classification Search
CPC ................ H01L 29/945; H01L 23/642; H01L 28/90–92; H01L 27/0805; H01L 29/66181; H01L 27/0694
See application file for complete search history.

(56) References Cited

U.S. PATENT DOCUMENTS

| | | |
|---|---|---|
| 8,488,299 B2 | 7/2013 | Wu et al. |
| 9,064,719 B1 | 6/2015 | Zhou et al. |
| 9,177,909 B2 | 11/2015 | Shih |
| 9,236,442 B2 | 1/2016 | Bhagavat et al. |
| 9,370,103 B2 | 6/2016 | Yun et al. |
| 9,412,734 B2 | 8/2016 | Zhou et al. |
| 10,079,277 B2 | 9/2018 | Yew et al. |
| 11,482,485 B2 | 10/2022 | Chen et al. |
| 2010/0181645 A1 | 7/2010 | Marenco |
| 2010/0308435 A1 | 12/2010 | Nowak et al. |
| 2017/0213650 A1* | 7/2017 | Fishburn ............... H01G 4/12 |
| 2018/0277622 A1* | 9/2018 | Nishiyama ............ H01L 28/90 |

FOREIGN PATENT DOCUMENTS

| | | |
|---|---|---|
| WO | WO2009104132 | 8/2009 |
| WO | WO2017145515 A1 | 8/2017 |

OTHER PUBLICATIONS

Office Action issued by USPTO on Nov. 28, 2023.

* cited by examiner

*Primary Examiner* — John A Bodnar
(74) *Attorney, Agent, or Firm* — WPAT, P.C

(57) ABSTRACT

A method for manufacturing a capacitor structure is provided. A substrate having a first side and a second side opposite to the first side is provided. A plurality of first trenches are formed on the first side. A first capacitor is formed extending along the first side and into the first trenches. A plurality of second trenches are formed on the second side. A second capacitor is formed extending along the second side and into the second trenches.

5 Claims, 11 Drawing Sheets

METHOD FOR MANUFACTURING CAPACITOR STRUCTURE

The application is a divisional application of U.S. patent application Ser. No. 17/136,075, filed on Dec. 29, 2020, the subject matter of which is incorporated herein by reference.

BACKGROUND OF THE INVENTION

Field of the Invention

The invention relates in general to a method for manufacturing a capacitor structure, and more particularly to a method for manufacturing a deep trench capacitor structure.

Description of the Related Art

A capacitor structure plays a critical role in a semiconductor device. In particular, the capacitor structure having a high capacitance is in highly demands. For example, a higher storage capacitance in DRAM can increase its stability; a higher capacitance in a decoupling capacitor can filter more noise. Accordingly, it is urged to develop a capacitor structure having a high capacitance.

SUMMARY OF THE INVENTION

In a comparison example, a capacitor structure may include a deep trench capacitor (DTC) formed on a single side of a substrate. In order to increase the capacitance of the capacitor structure, depths of the trenches for the capacitor are desired to be increased. However, if depths of the trenches for the capacitor are too deep, insulating layer(s) and conductive layer(s) included in the capacitor may not be properly formed in the trenches, and problems of the current leakage or dielectric breakdown may be occurred. Therefore, there is a need for developing a capacitor structure to improve the problems described above.

The present invention is directed to a capacitor structure and a method for manufacturing the capacitor structure.

According to an embodiment of the present invention, a capacitor structure is provided. A capacitor structure comprises a substrate having a first side and a second side opposite to the first side; a plurality of first trenches formed on the first side of the substrate; a plurality of second trenches formed on the second side of the substrate; a first capacitor extending along the first side and into the first trenches; and a second capacitor extending along the second side and into the second trenches.

According to another embodiment of the present invention, a method for manufacturing a capacitor structure is provided. The method comprises: providing a substrate having a first side and a second side opposite to the first side; forming a plurality of first trenches on the first side; forming a first capacitor extending along the first side and into the first trenches; forming a plurality of second trenches on the second side; and forming a second capacitor extending along the second side and into the second trenches.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
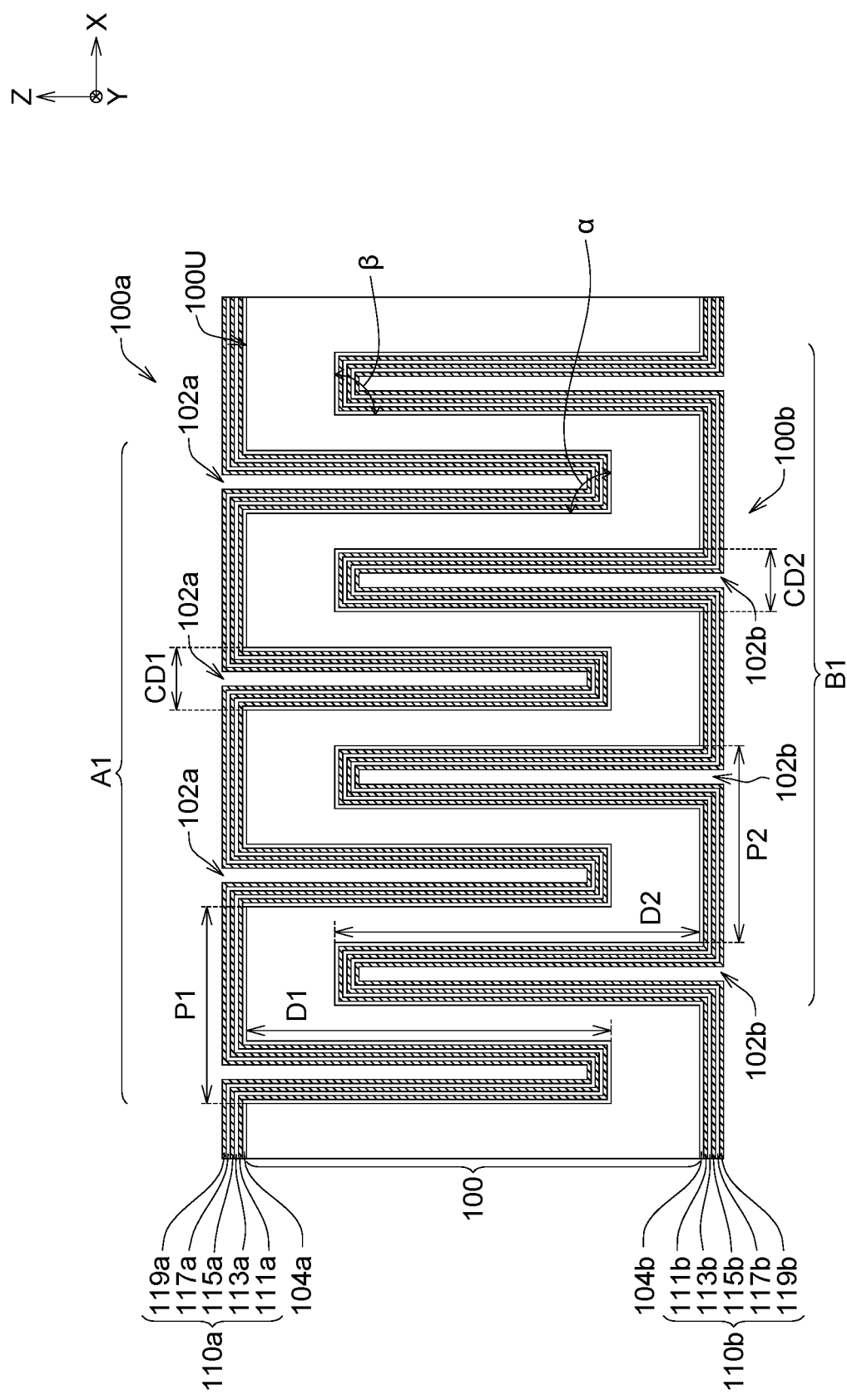
FIG. 1A is a cross-sectional view illustrating a capacitor structure according to a first embodiment of the present invention.

Embodiments of the present application will be described in detail below with reference to the accompanying drawings. It should be noted that the structures, processes, and contents of the embodiments are merely illustrative, and the scope of the present application is not limited to the aspects described. It is to be understood that the present application dose not show all possible embodiments, and is not to be construed as being limited by the scope of the application, and the structure and process of the embodiments may be varied and modified to meet the needs of the application for one of ordinary skill in the art. Therefore, other implementations not presented in this application may also be applicable.

Further, in the embodiments, the same or similar elements are designated by the same or similar reference numerals for clarity. In addition, the drawings have been simplified to clearly illustrate the contents of the embodiments, and the scale ratios in the drawings are not drawn to scale in accordance with the actual products, and thus are not intended to limit the scope of the application.

Figure 1B:
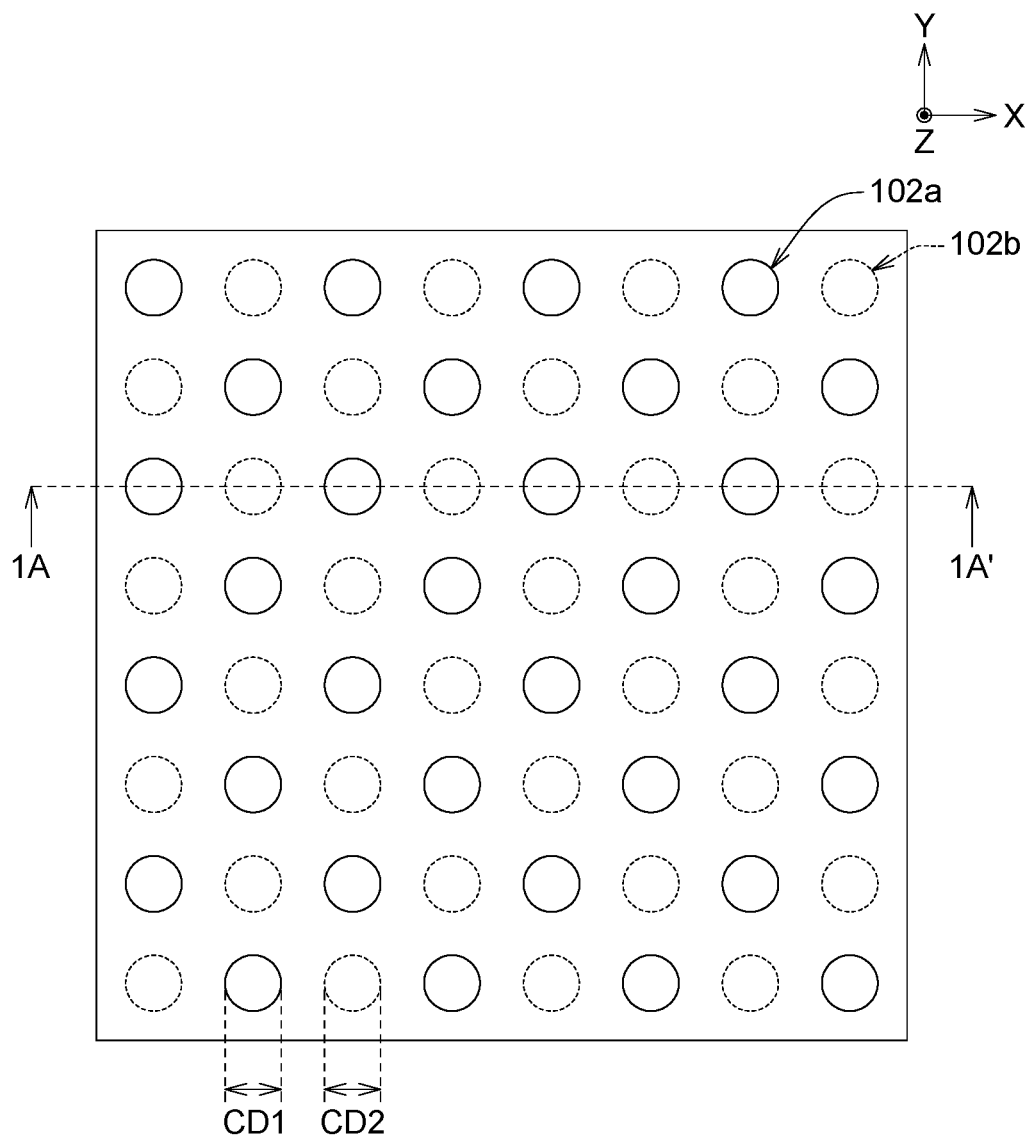
FIG. 1B is a top view illustrating a plurality of first trenches and a plurality of second trenches in the capacitor structure of FIG. 1.

FIG. 1A is a cross-sectional view illustrating a capacitor structure 10 according to a first embodiment of the present invention. FIG. 1B is a top view illustrating a plurality of first trenches 102a and a plurality of second trenches 102b in the capacitor structure 10 of FIG. 1A. FIG. 1A shows a plane formed by a first direction (i.e. X direction) and a third direction (i.e. Z direction) and corresponding to line 1A-1A' of FIG. 1B. FIG. 1B shows a plane formed by the first direction (i.e. X direction) and a second direction (i.e. Y direction), and the elements formed in/on the first trenches 102a and the second trenches 102b are omitted in FIG. 1B.

Referring to FIGS. 1A and 1B, a capacitor structure 10 comprises a substrate 100 having a first side 100a and a second side 100b opposite to the first side 100a; a plurality of first trenches 102a formed on the first side 100a of the substrate 100; a plurality of second trenches 102b formed on the second side 100b of the substrate 100; a first capacitor 110a extending along the first side 100a and into the first trenches 102a; and a second capacitor 110b extending along the second side 100b and into the second trenches 102b.

As shown in FIG. 1A, the substrate 100 has an upper surface 100U corresponding to the first side 100a of the substrate 100. As shown in FIG. 1B, the first trenches 102a are disposed along the first direction (i.e. X direction) and the second direction (i.e. Y direction) on the first side 100a of the substrate, the first direction and the second direction are intersected with each other and parallel to the upper surface 100U of the substrate 100. That is, the first side 100a corresponds to the upper surface 100O of the substrate 100, and the second side 100b corresponds to a lower surface of the substrate 100. The first trenches 102a and the second trenches 102b penetrate portions of the substrate 100 along the third direction (i.e. Z direction). More specifically, the first trenches 102a extend from an upper surface 100O of the substrate 100 to the inner portion of the substrate 100, and the second trenches 102b extend from a lower surface of the substrate 100 to the inner portion of the substrate 100. In some embodiments, the extending directions of the first trenches 102a and the second trenches 102b are parallel to the third direction (i.e. Z direction).

In the present embodiment, as shown in FIG. 1A, an angle α formed between a sidewall of the first trench 102a and a bottom of the first trench 102a is 90 degrees, and an angle β formed between a sidewall of the second trench 102b and a bottom of the second trench 102b is 90 degrees. In other embodiments, the angle α formed between the sidewall of the first trench 102a and the bottom of the first trench 102a may be greater than 90 degrees, or/and the angle β formed between the sidewall of the second trench 102b and the bottom of the second trench 102b may be greater than 90 degrees, such that the first trench 102a or/and the second trench 102b may have a tapered sidewall.

Referring to FIGS. 1A and 1B, the first trenches 102a and the second trenches 102b are separated in the third direction (i.e. Z direction), and are alternatively disposed in the substrate 100, such that the first capacitor 110a formed in the first trenches 102a and the second capacitor 110b formed in the second trenches 102b are alternatively disposed in the substrate 100. In the present embodiment, the first trenches 102a and the second trenches 102b are overlapped in the first direction (i.e. X direction), that is, a first depth D1 of each of the first trenches 102a and a second depth D2 of each of the second trenches 102b may be greater than half of a thickness of the substrate 100, respectively, but the present application is not limited thereto. In other embodiments, the first trenches 102a and the second trenches 102b may be separated in the first direction (i.e. X direction). In some embodiments, the first depth D1 may be equal to the second depth D2.

In some embodiments, referring to FIGS. 1A and 1B, each of the first trenches 102a and each of the second trenches 102b may have a first critical dimension CD1 and a second critical dimension CD2 along the first direction (i.e. X direction), respectively. A first pitch P1 may be formed between two neighboring first trenches 102a along the first direction (i.e. X direction). A second pitch P2 may be formed between two neighboring second trenches 102b along the first direction (i.e. X direction). An aspect ratio of the first trenches 102a of the first critical dimension CD1 to the first depth D1 (CD1:D1) may be equal to or smaller than 1:15, for example, CD1:D1=1:10. An aspect ratio of the second trenches 102b of the second critical dimension CD2 to the second depth D2 (CD2:D2) may be equal to or smaller than 1:15, for example, CD2:D2=1:10. A ratio of the first critical dimension CD1 to the first pitch P1 may be equal to or greater than 1:2.2, for example, CD1:P1=1:3. A ratio of the second critical dimension CD2 to the second pitch P2 may be equal to or greater than 1:2.2, for example, CD2:P2=1:3.

As shown in FIG. 1A, a first insulating film 104a extends along the first side 100a and into the first trenches 102a and a second insulating film 104b extends along the second side 100b and into the second trenches 102b. The first insulating film 104a is formed between the substrate 100 and the first capacitor 110a. The second insulating film 104b is formed between the substrate 100 and the second capacitor 110b. That is, portions of the upper surface 100O of the substrate 100, the sidewalls of the first trenches 102a and the bottoms of the first trenches 102a are covered by the first insulating film 104a and the first capacitor 110a, and portions of the lower surface of the substrate 100, the sidewalls of the second trenches 102b and the bottoms of the second trenches 102b are covered by the second insulating film 104b and the second capacitor 110a. In the present embodiment, the first capacitor 110a comprises a first conductive layer 111a, a first dielectric layer 113a, a second conductive layer 115a, a second dielectric layer 117a and a third conductive layer 119a sequentially stacked on the first side 110a of the substrate 100 and into the first trenches 102a; and the second capacitor 110b comprises a first conductive layer 111b, a first dielectric layer 113b, a second conductive layer 115b, a second dielectric layer 117b and a third conductive layer 119b sequentially stacked on the second side 110b of the substrate 100 and into the second trenches 102b. The first capacitor 110a and the second capacitor 110b include a "MIMIM (metal-insulator-metal-insulator-metal)" structure, respectively. However, the amounts of the dielectric layer(s) and the conductive layers in the first capacitor 110a and the second capacitor are not limited thereto.

In the present embodiment, the first trenches 102a are disposed in a first region A1 on the first side 100a of the substrate 100, and the second trenches 102b are disposed in a second region B1 on the second side 100b of the substrate 100. The first region A1 corresponds to the second region B1; in other words, the first region A1 and the second region B1 are overlapped in the third direction (i.e. Z direction), but the present invention is not limited thereto.

In some embodiments, the substrate 100 may be a silicon-based substrate. The first conductive layers 111a and 111b, the second conductive layers 115a and 115b and the third conductive layers 119a and 119b may include a material formed of copper, titanium nitride (TiN) or any other suitable conductive materials. The first dielectric layers 113a and 113b and the second dielectric layers 117a and 117b may include a material formed of the thermal oxide, oxide-nitride-oxide (ONO) composite film or other suitable dielectric materials.

In some embodiments, the substrate 100 may be applied in an interposer, a Silicon on Insulator (SOI) wafer or other suitable substrate. In some embodiments, the substrate 100 may have a thickness in a range of 50-100 μm along the third direction (i.e. Z direction), but the present application is not limited thereto.

Figure 7:
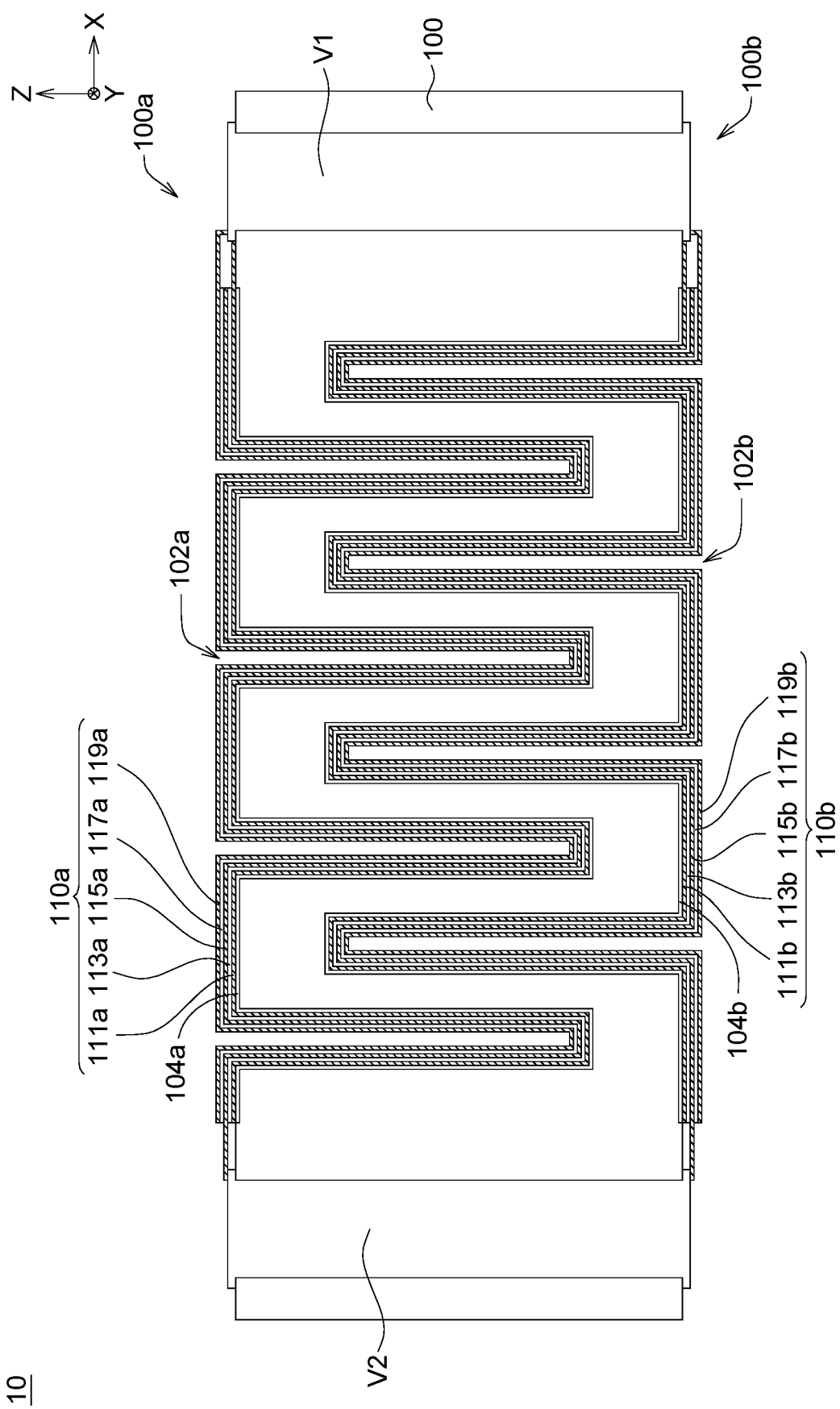
FIG. 7 illustrates the capacitor structure applied in an interposer according to an embodiment of the present application.

In some embodiments, the first capacitor 110a and the second capacitor 110b may be electrically connected to different elements/devices. In some embodiments, the first capacitor 110a and the second capacitor 110b may be electrically connected together as one capacitor, for example, by the through silicon via (TSV), as shown in FIG. 7.

In a first comparative example, a capacitor structure has only a first capacitor formed on a single side of a substrate and formed into first trenches, the other side of the substrate has no trenches and the capacitor, and the pitch, the depth, and the critical dimension of the first trenches are respectively the same as the pitch, the depth, and the critical dimension of the first trenches 102a shown in FIG. 1A of the present invention.

Since the capacitor structure 10 of the present invention has double-sided deep trench capacitors (capacitors 110a and 110b), the surface area of the capacitors 110a and 110b in the present invention is higher than the surface area of the capacitor in the first comparative example having the single-sided deep trench capacitor, the capacitor structure 10 of the present invention may have higher capacitance (such as 1.7 times). If the capacitance of the capacitor structure in the first comparative example is desired to achieve the capacitance of the capacitor structure in the present invention, a depth of the first trenches has to be increased (such as 21 μm) and a pitch of the first trenches has to be decreased (such as 2 μm), such that the process window and the process cost have to be increased; the aspect ratio of the first trenches may be too high (such as 1:21) and the critical dimension to the pitch may be too low (such as 1:2), the dielectric layers and the conductive layers of the capacitor in the first trenches may not be properly formed, thereby increasing the risk of current leakage or dielectric breakdown. Further, the process for forming the first capacitor and the second capacitor may be identical or similar, so that the process for forming the capacitor structure 10 is simple. Accordingly, the capacitor structure 10 according to an embodiment of the present invention may achieve a higher capacitance in a low process cost while maintaining a good electrical property without sacrificing process window and can also avoid process complexity.

Figure 2:
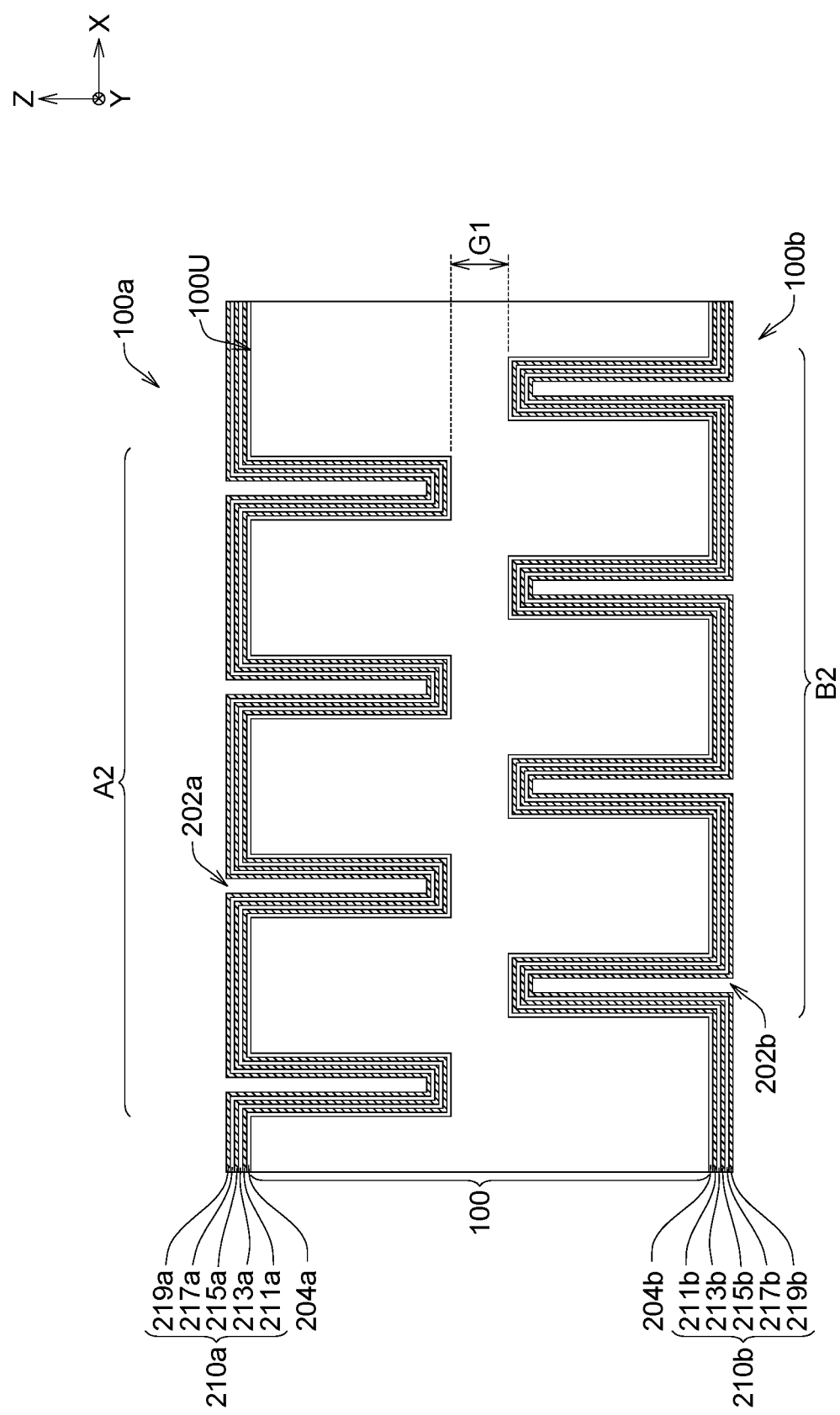
FIG. 2 is a cross-sectional view illustrating a capacitor structure according to a second embodiment of the present invention.

FIG. 2 is a cross-sectional view illustrating a capacitor structure 20 according to a second embodiment of the present invention, and shows a plane formed by the first direction (i.e. X direction) and the third direction (i.e. Z direction). The configuration of the capacitor structure 20 and the configuration of the capacitor structure 10 shown in FIG. 1 are similar, and the difference between the capacitor structure 20 and the capacitor structure 10 is in that the depths of the first trenches 202a and the second trenches 202b are smaller than the depths of the first trenches 102a and the second trenches 102b, and the identical/similar features are not repeated here.

Referring to FIG. 2, the first trenches 202a and the second trenches 202b are separated in the third direction (i.e. Z direction), and are separated in the first direction (i.e. X direction). In the present embodiment, a gap G1 may be formed between the first trenches 202a and the second trenches 202b projected on a plane perpendicular to the upper surface 1000 of the substrate 100. In other embodiments, there may be no gap between the first trenches 202a and the second trenches 202b projected on a plane perpendicular to the upper surface 1000 of the substrate 100; the bottoms of the first trenches 202a and the bottoms of the second trenches 202b may be aligned along the first direction (i.e. X direction). A first insulating film 204a and a first capacitor 210a comprising a first conductive layer 211a, a first dielectric layer 213a, a second conductive layer 215a, a second dielectric layer 217a and a third conductive layer 219a extend along the first side 100a and into the first trenches 102a; a second insulating film 204b and a second capacitor 210a comprising a first conductive layer 211b, a first dielectric layer 213b, a second conductive layer 215b, a second dielectric layer 217b and a third conductive layer 219b extend along the second side 100b and into the second trenches 202b. The materials and properties of the first insulating film 204a, the first capacitor 210a, the second insulating film 204b and the second capacitor 210b are respectively identical or similar to the materials and properties of the first insulating film 104a, the first capacitor 110a, the second insulating film 104b and the second capacitor 110b.

In the present embodiment, the first trenches 202a and the second trenches 202b are disposed in a first region A2 on the first side 100a of the substrate 100 and a second region B2 on the second side 100b of the substrate 100, respectively, and the first region A2 and the second region B2 are overlapped in the third direction (i.e. Z direction), but the present invention is not limited thereto.

Figure 3:
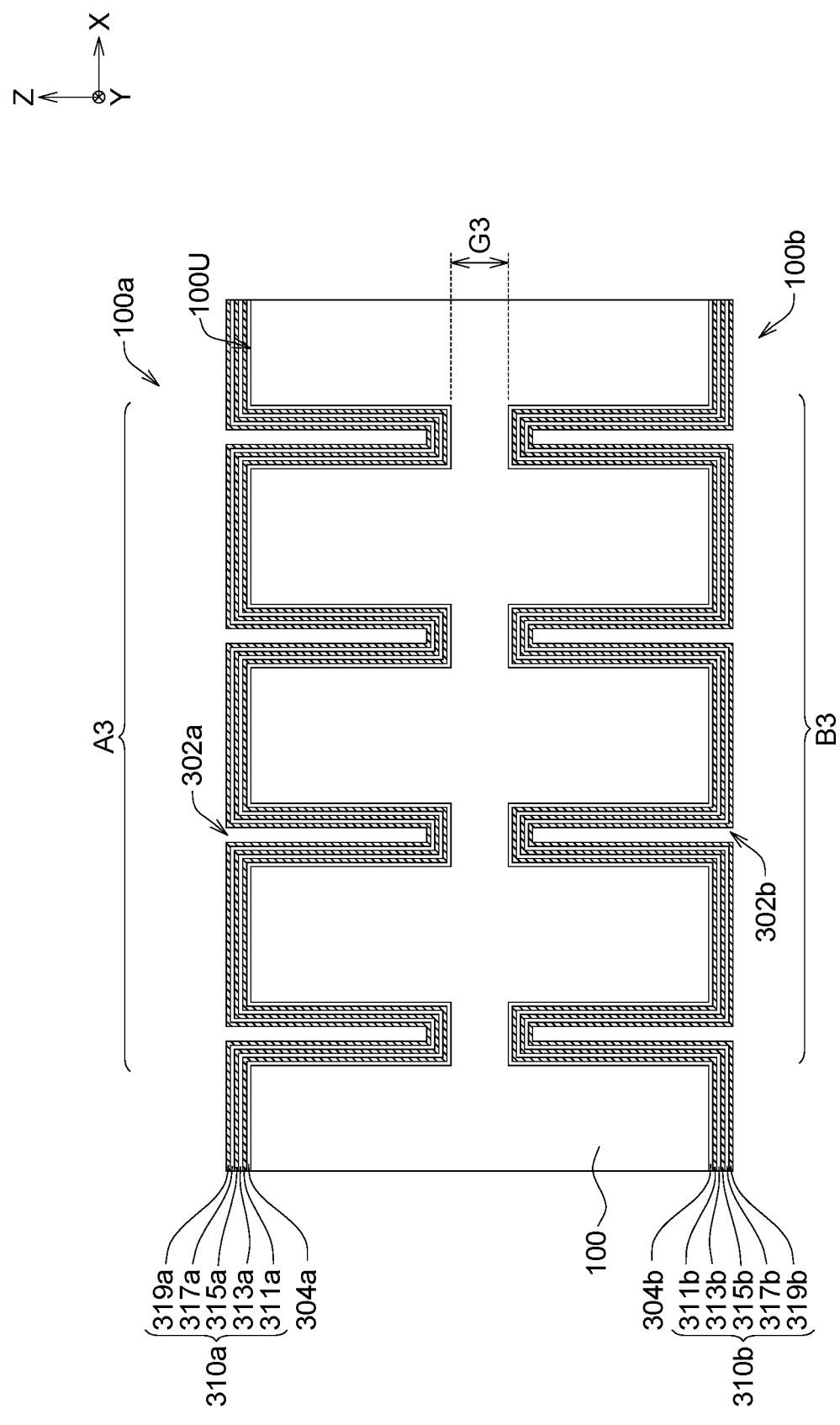
FIG. 3 is a cross-sectional view illustrating a capacitor structure according to a third embodiment of the present invention.

FIG. 3 is a cross-sectional view illustrating a capacitor structure 30 according to a third embodiment of the present invention, and shows a plane formed by the first direction (i.e. X direction) and the third direction (i.e. Z direction). The difference between the capacitor structure 30 and the capacitor structure 10 is in that the depths of the first trenches 302a and the second trenches 302b are smaller than the depths of the first trenches 102a and the second trenches 102b; the arrangement of the first trenches 302a and the second trenches 302b and the arrangement of the first trenches 102a and the second trenches 102b are different; the identical/similar features are not repeated here.

Referring to FIG. 3, the first trenches 302a and the second trenches 302b are separated in the first direction (i.e. X direction), and are overlapped in the third direction (i.e. Z direction). In the present embodiment, a gap G3 may be formed between the first trenches 302a and the second trenches 302b projected on a plane perpendicular to the upper surface 1000 of the substrate 100. A first insulating film 304a and a first capacitor 310a comprising a first conductive layer 311a, a first dielectric layer 313a, a second conductive layer 315a, a second dielectric layer 317a and a third conductive layer 319a extend along the first side 100a and into the first trenches 302a; a second insulating film 304b and a second capacitor 310a comprising a first conductive layer 311b, a first dielectric layer 313b, a second conductive layer 315b, a second dielectric layer 317b and a third conductive layer 319b extend along the second side 100b and into the second trenches 302b. The materials and properties of the first insulating film 304a, the first capacitor 310a, the second insulating film 304b and the second capacitor 310b are respectively identical or similar to the materials and properties of the first insulating film 104a, the first capacitor 110a, the second insulating film 104b and the second capacitor 110b.

In the present embodiment, the first trenches 302a and the second trenches 302b are disposed in a first region A3 on the first side 100a of the substrate 100 and a second region B3 on the second side 100b of the substrate 100, respectively, and the first region A3 and the second region B3 are overlapped in the third direction (i.e. Z direction), but the present invention is not limited thereto.

Figure 4:
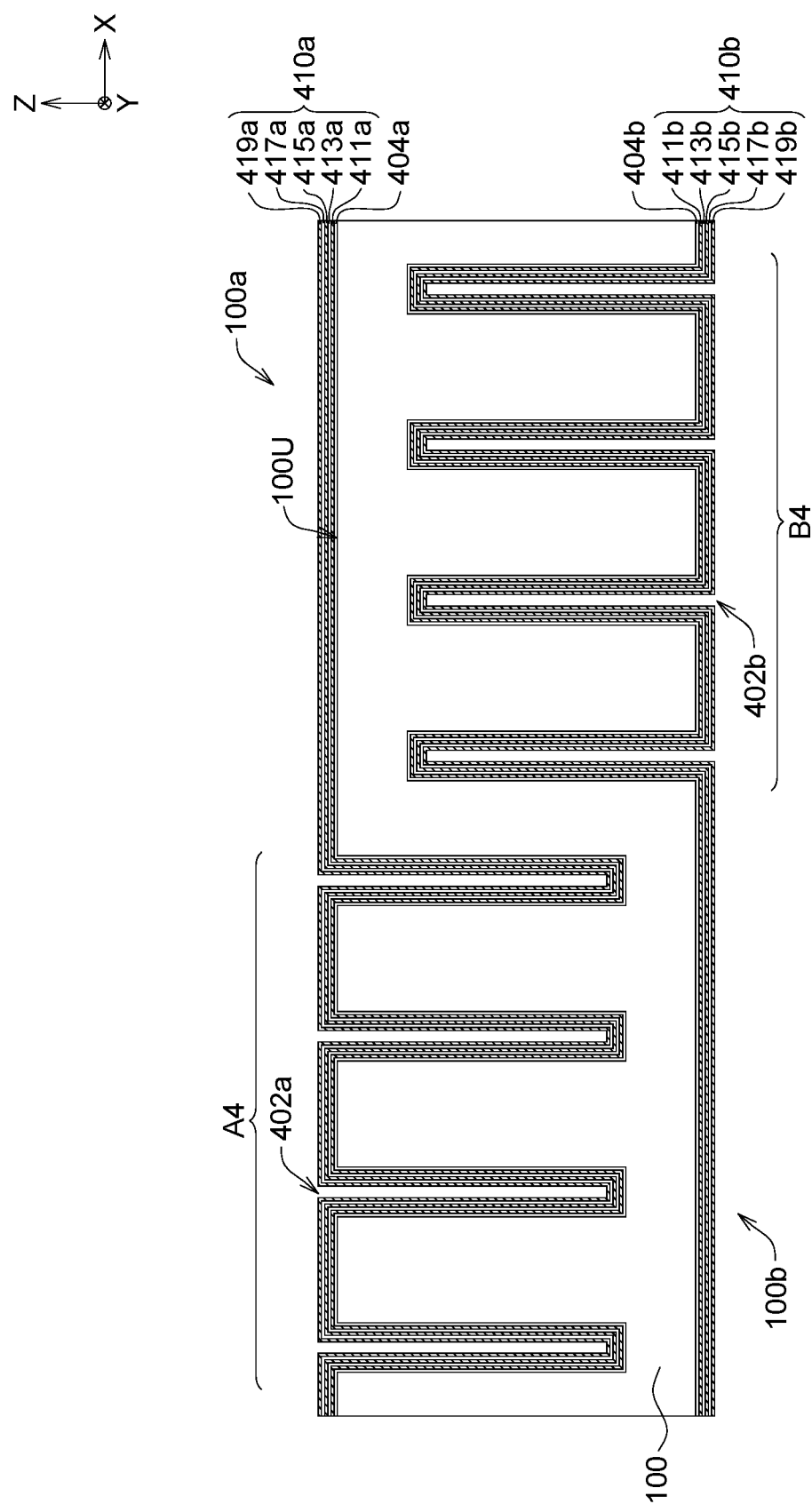
FIG. 4 is a cross-sectional view illustrating a capacitor structure according to a fourth embodiment of the present invention.

FIG. 4 is a cross-sectional view illustrating a capacitor structure 40 according to a fourth embodiment of the present invention, and shows a plane formed by the first direction (i.e. X direction) and the third direction (i.e. Z direction). The arrangement of the first trenches 402a and the second trenches 402b in the capacitor structure 40 and the arrangement of the first trenches 102a and the second trenches 102b in the capacitor structure 10 are different, and the identical/similar features are not repeated here.

Referring to FIG. 4, a first insulating film 404a and a first capacitor 410a comprising a first conductive layer 411a, a first dielectric layer 413a, a second conductive layer 415a, a second dielectric layer 417a and a third conductive layer 419a extend along the first side 100a and into the first trenches 402a; a second insulating film 404b and a second capacitor 410b comprising a first conductive layer 411b, a first dielectric layer 413b, a second conductive layer 415b, a second dielectric layer 417b and a third conductive layer 419b extend along the second side 100b and into the second trenches 402b. The materials and properties of the first insulating film 404a, the first capacitor 410a, the second insulating film 404b and the second capacitor 410b are respectively identical or similar to the materials and properties of the first insulating film 104a, the first capacitor 110a, the second insulating film 104b and the second capacitor 110b.

In the present embodiment, the first trenches 402a are disposed in a first region A4 on the first side 100a of the substrate 100, and the second trenches 402b are disposed in a second region B4 on the second side 100b of the substrate 100, and the first region A4 and the second region B4 are separated from each other in the third direction (i.e. Z direction). The first trenches 402a and the second trenches 402b are overlapped in the first direction (i.e. X direction).

Figure 5:
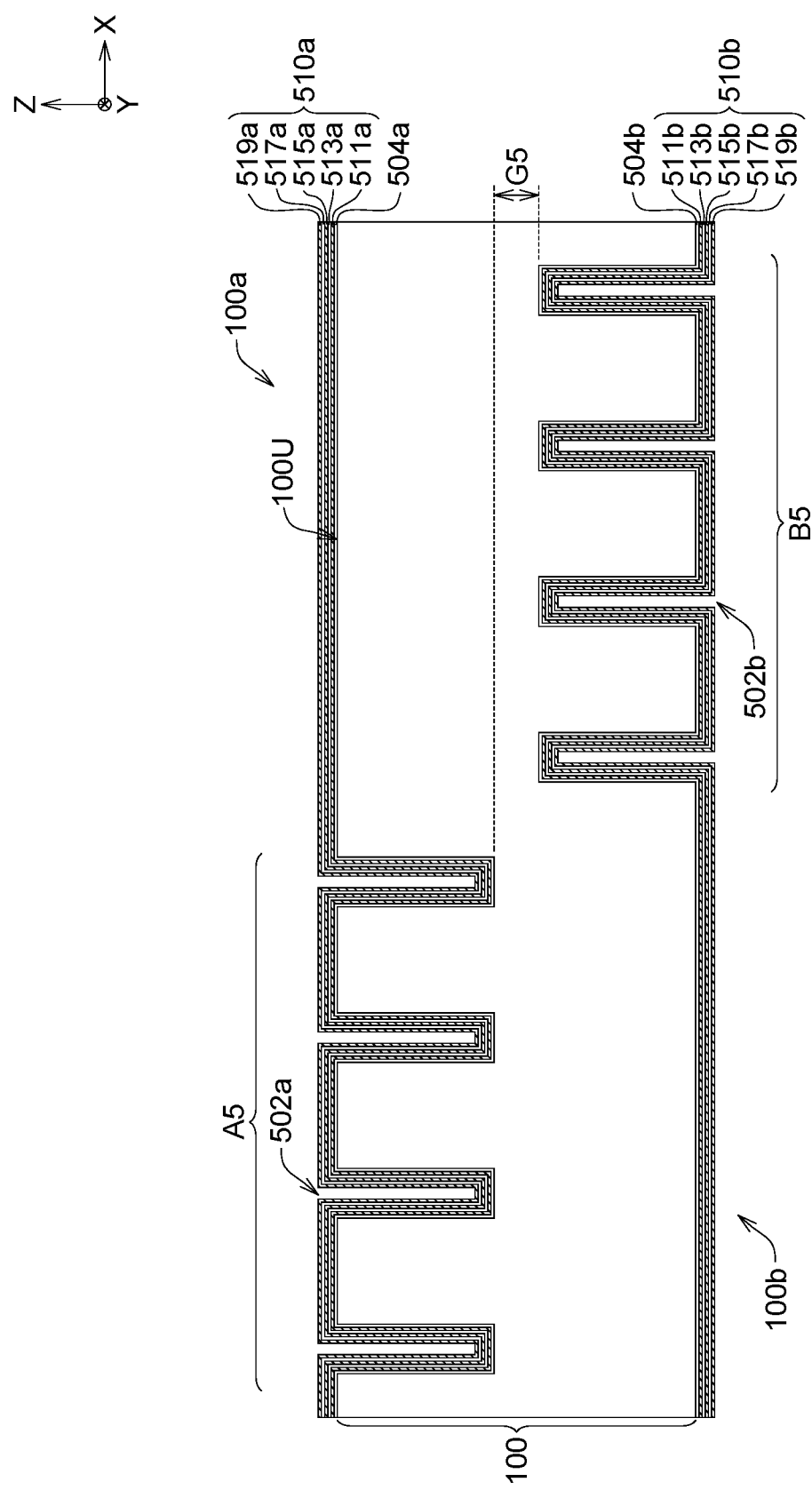
FIG. 5 is a cross-sectional view illustrating a capacitor structure according to a fifth embodiment of the present invention.

FIG. 5 is a cross-sectional view illustrating a capacitor structure 50 according to a fifth embodiment of the present invention, and shows a plane formed by the first direction (i.e. X direction) and the third direction (i.e. Z direction). The depths of the first trenches 402a and the second trenches 402b in capacitor structure 50 are smaller than the depths of the first trenches 102a and the second trenches 102b in capacitor structure 10; the arrangement of the first trenches 402a and the second trenches 402b are different from the arrangement of the first trenches 102a and the second trenches 102b, and the identical/similar features are not repeated here.

Referring to FIG. 5, a first insulating film 504a and a first capacitor 510a comprising a first conductive layer 511a, a first dielectric layer 513a, a second conductive layer 515a, a second dielectric layer 517a and a third conductive layer 519a extend along the first side 100a and into the first trenches 502a; a second insulating film 504b and a second capacitor 510a comprising a first conductive layer 511b, a first dielectric layer 513b, a second conductive layer 515b, a second dielectric layer 517b and a third conductive layer 519b extend along the second side 100b and into the second trenches 502b. The materials and properties of the first insulating film 504a, the first capacitor 510a, the second insulating film 504b and the second capacitor 510b are respectively identical or similar to the materials and properties of the first insulating film 104a, the first capacitor 110a, the second insulating film 104b and the second capacitor 110b.

In the present embodiment, the first trenches 502a and the second trenches 502b are disposed in a first region A5 and a second region B5 of the substrate 100, respectively, and the first region A5 and the second region B5 are separated in the third direction (i.e. Z direction). The first trenches 502a and the second trenches 502b are also separated in the third direction (i.e. Z direction). The first trenches 502a and the second trenches 502b are separated in the first direction (i.e. X direction). A gap G5 may be formed between the first trenches 502a and the second trenches 502b projected on a plane perpendicular to the upper surface 1000 of the substrate 100. In other embodiments, there is no gap formed between the first trenches 502a and the second trenches 502b projected on a plane perpendicular to the upper surface 100U of the substrate 100.

Figure 6A:
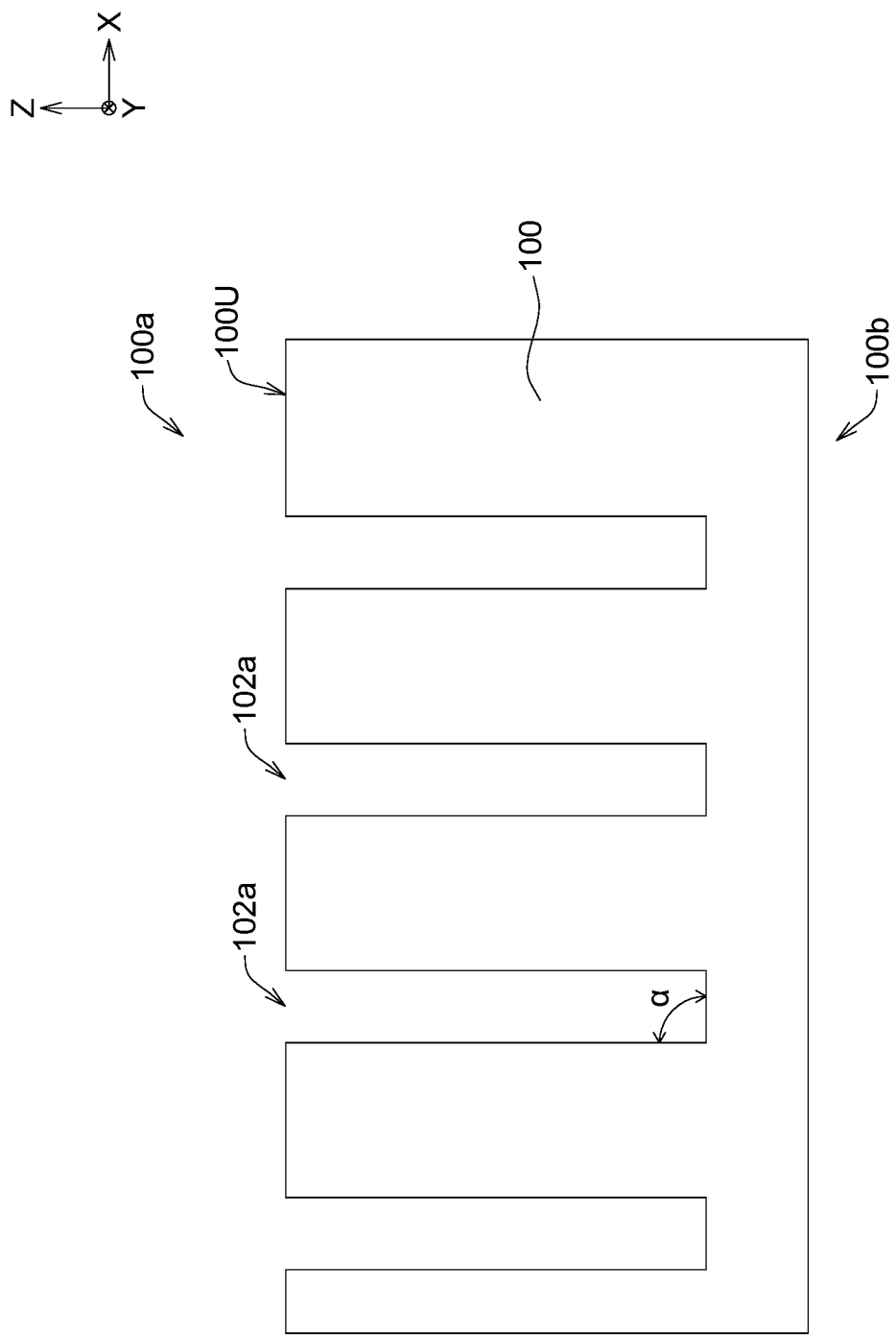
FIGS. 6A-6C illustrate a method for manufacturing the capacitor structure according to an embodiment of the present application.
Figure 6B:
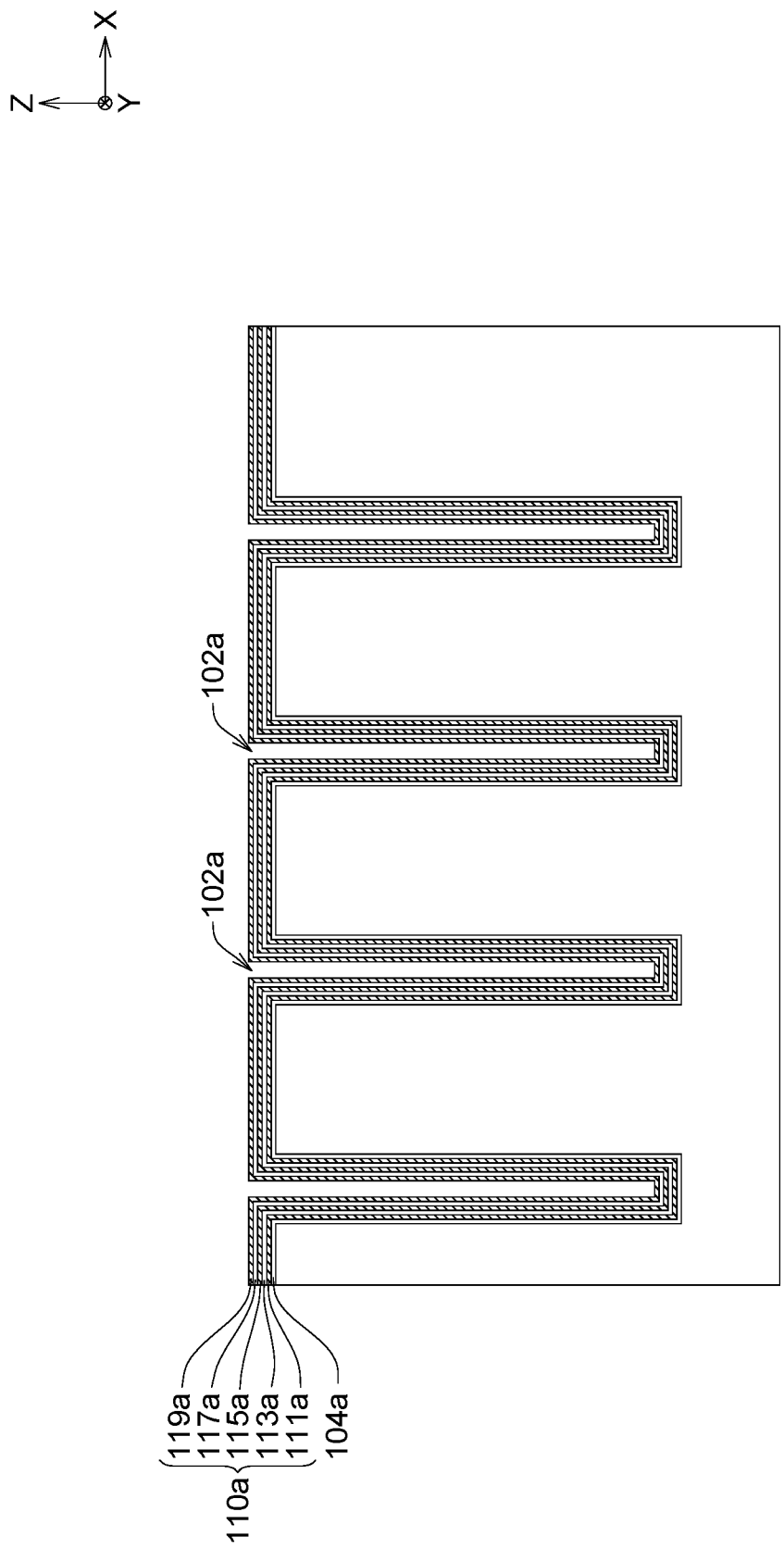
Figure 6C:
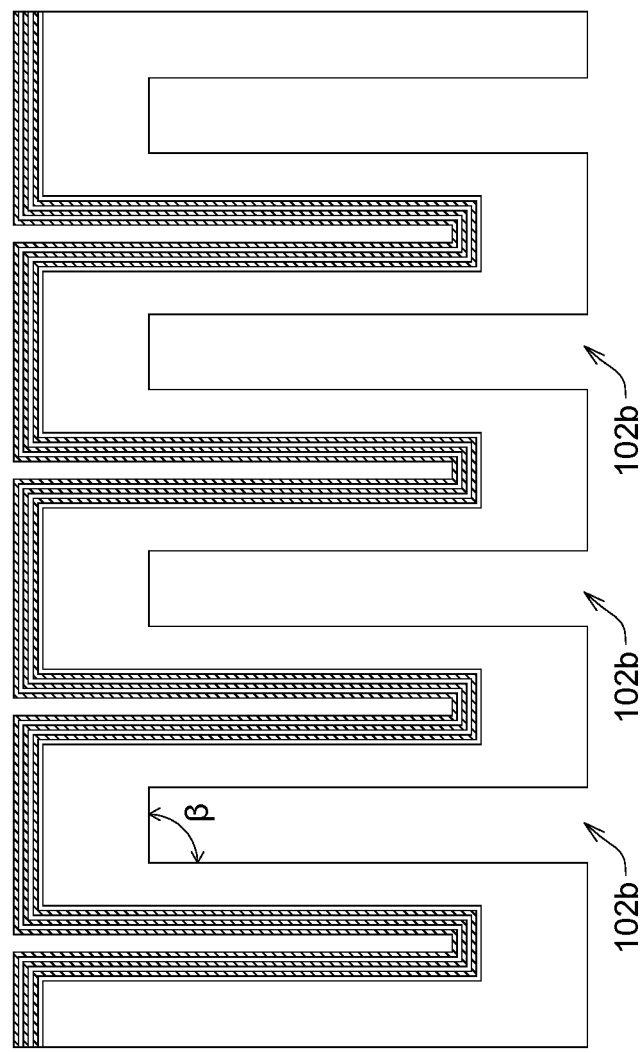

FIGS. 6A-6C illustrate a method for manufacturing the capacitor structure 10 according to an embodiment of the present application. The capacitor structure 10 may be manufactured according to the following steps, but the invention is not limited thereto. Other capacitor structures 20-50 may be manufactured by a method similar to the method for manufacturing the capacitor structure 10.

Referring to FIG. 6A, a substrate 100 is provided. The substrate 100 has a first side 100a and a second side 100b opposite to the first side 100a. The substrate 100 may be applied in an interposer, a Silicon on Insulator (SOI) wafer or other suitable substrate. Then, a plurality of first trenches 102a are formed on the first side 100a. The first trenches 102a are disposed along a first direction (X direction) and a second direction (Y direction) on the first side 100a of the substrate 100. Each of the first trenches 102a penetrates a portion of the substrate 100, and extends from an upper surface 1000 of the substrate 100 into the inner portion of the substrate 100 along the third direction (i.e. Z direction). In the present embodiment, an angle α formed between a sidewall of the first trench 102a and a bottom of the first trench 102a is 90 degrees. In other embodiments, the angle α formed between the sidewall of the first trench 102a and the bottom of the first trench 102a may be greater than 90 degrees, such that the first trench 102a may have a tapered sidewall.

Referring to FIG. 6B, a first insulating film 104a and a first capacitor 110a comprising a first conductive layer 111a, a first dielectric layer 113a, a second conductive layer 115a, a second dielectric layer 117a and a third conductive layer 119a are formed extending along the first side 110a of the substrate 100 and into the first trenches 102a. For example, the first insulating film 104a, the first conductive layer 111a, the first dielectric layer 113a, the second conductive layer 115a, the second dielectric layer 117a and the third conductive layer 119a are sequentially deposited on the first side 110a of the substrate 100 and into the first trenches 102a.

Referring to FIG. 6C, a plurality of second trenches 102b are formed on the second side 100b. Each of the second trenches 102b penetrates a portion of the substrate 100, and extends from a bottom surface of the substrate 100 into the inner portion of the substrate 100 along the third direction (i.e. Z direction). In the present embodiment, an angle β formed between a sidewall of the second trench 102b and a bottom of the second trench 102b is 90 degrees. In other embodiments, the angle β formed between the sidewall of the second trench 102b and the bottom of the second trench 102b may be greater than 90 degrees, such that the second trench 102b may have a tapered sidewall.

Afterwards, referring back to FIG. 1A, a second insulating film 104b and a second capacitor 110b comprising a first conductive layer 111b, a first dielectric layer 113b, a second conductive layer 115b, a second dielectric layer 117b and a third conductive layer 119b are formed extending along the second side 110b of the substrate 100 and into the second trenches 102b. For example, the second insulating film 104b, the first conductive layer 111b, the first dielectric layer 113b, the second conductive layer 115b, the second dielectric layer 117b and the third conductive layer 119b are sequentially deposited on the second side 110b of the substrate 100 and into the second trenches 102b. In this way, the capacitor structure 10 having double-sided deep trench capacitors (first capacitor 110a and second capacitor 110b) is formed.

FIG. 7 illustrates the capacitor structure 10 applied in an interposer according to an embodiment of the present application.

Referring to FIG. 7, a first via V1 and a second via V2 penetrate through the substrate 100 along the third direction, respectively. The first capacitor 110a comprises a first conductive layer 111a, a first dielectric layer 113a, a second conductive layer 115a, a second dielectric layer 117a and a third conductive layer 119a sequentially stacked on the first side of the substrate, the second capacitor 110b comprises a first conductive layer 111b, a first dielectric layer 113b, a second conductive layer 115b, a second dielectric layer 117b and a third conductive layer 119b sequentially stacked on the second side 110b of the substrate 100. That is, the first capacitor 110a and the second capacitor 110b include a "MIMIM (metal-insulator-metal-insulator-metal) structure", respectively. The first insulating film 104a and the first capacitor 110a extend along the first side 100a and into the first trenches 102a. The second insulating film 104b and the second capacitor 110b extend along the second side 100b and into the second trenches 102b. The first conductive layer 111a of the first capacitor 110a, the first conductive layer 111b of the second capacitor 110b, the third conductive layer 119a of the first capacitor 110a and the third conductive layer 119b of the second capacitor 110b are electrically connected to the first via V1; the second conductive layer 115a of the first capacitor 110a, the second conductive layer 115b of the second capacitor 110b are electrically connected to the second via V2, such that the first capacitor 110a and the second capacitor 110b are electrically connected to each other as one capacitor through the first via V1 and the second via V2.

Figure 8:
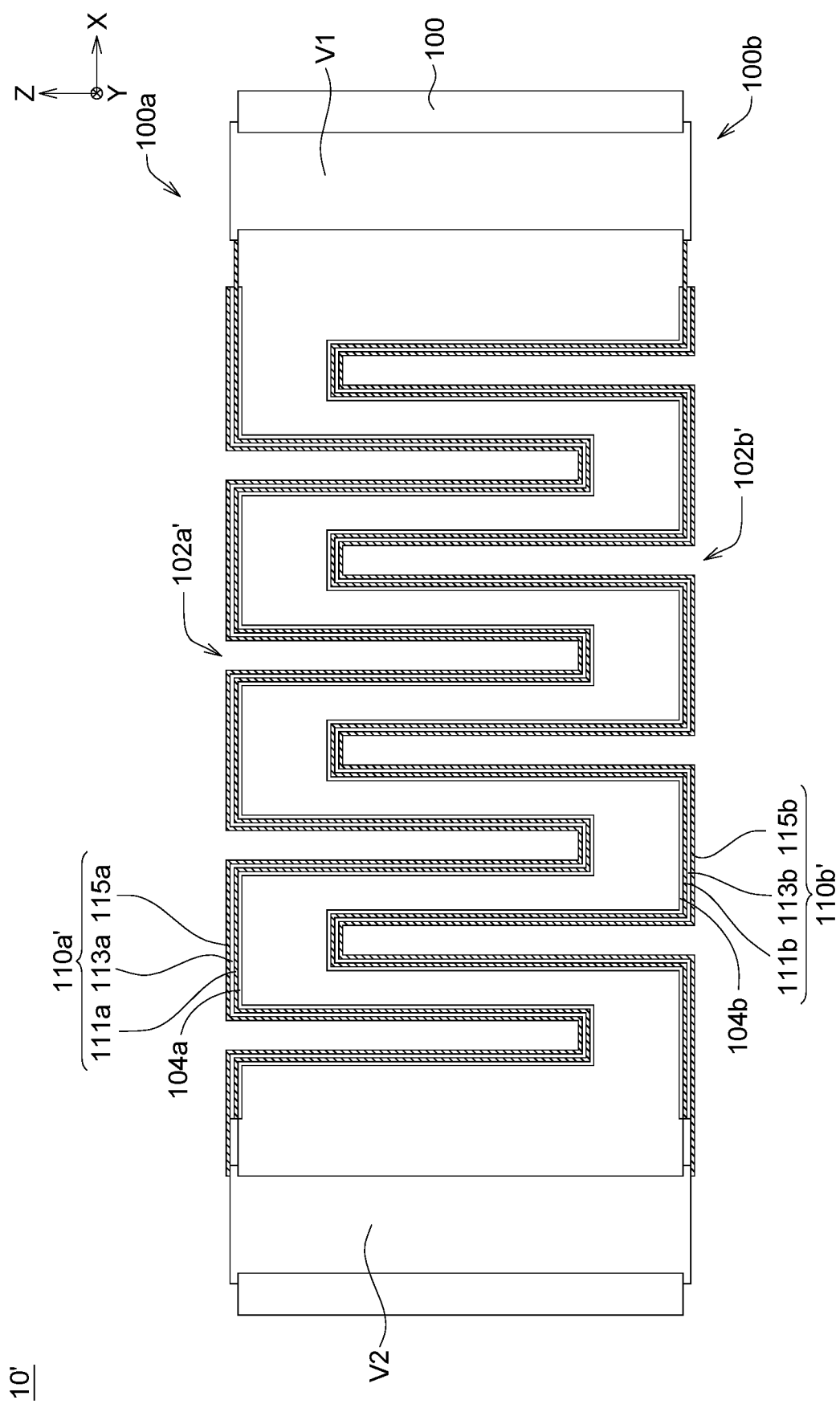
FIG. 8 illustrates the capacitor structure applied in an interposer according to another embodiment of the present application.

FIG. 8 illustrates the capacitor structure 10' applied in an interposer according to another embodiment of the present application. The difference between the capacitor structure 10' and 10 is in that the structure of the first capacitor 110a' and the second capacitor 110b' are different from the structure of the first capacitor 110a and the second capacitor 110b.

Referring to FIG. 8, a first via V1 and a second via V2 penetrate through the substrate 100 along the third direction, respectively. The first capacitor 110a' comprises a first conductive layer 111a, a first dielectric layer 113a and a second conductive layer 115a sequentially stacked on the first side 100a of the substrate 100, the second capacitor 110b' comprises a first conductive layer 111b, a first dielectric layer 113b and a second conductive layer 115b sequentially stacked on the second side 100b of the substrate 100. That is, the first capacitor 110a' and the second capacitor 110b' include a "MIM (metal-insulator-metal) structure", respectively. The first insulating film 104a and the first capacitor 110a' extend along the first side 100a and into the first trenches 102a. The second insulating film 104b and the second capacitor 110b' extend along the second side 100b and into the second trenches 102b. The first conductive layer 111a of the first capacitor 110a', the first conductive layer 111b of the second capacitor 110b' are electrically connected to a first via V1; the second conductive layer 115a of the first capacitor 110a', the second conductive layer 115b of the second capacitor 110b' are electrically connected to a second via V2, such that the first capacitor 110a' and the second capacitor' 110b are electrically connected together as one capacitor through the first via V1 and the second via V2.

In sum, the present invention provides a capacitor structure and a method for manufacturing the capacitor structure. According to one embodiment of the present invention, a capacitor structure comprises a substrate having a first side and a second side opposite to the first side; a plurality of first trenches formed on the first side of the substrate; a plurality of second trenches formed on the second side of the substrate; a first capacitor extending along the first side and into the first trenches; and a second capacitor extending along the second side and into the second trenches.

Since the capacitor structure of the present invention has double-sided deep trench capacitors (i.e. first capacitor and the second capacitor), the surface area of the capacitors in the present invention is higher than the surface area of the capacitor in a comparative example having the single-sided deep trench capacitor, and the capacitor structure of the present invention may have higher capacitance. Further, the high capacitance of the present application can be achieved without making the first trenches and the second trenches too deep, so that the risk of current leakage or dielectric breakdown in the capacitor may be decreased. Additionally, the process for forming the first capacitor and the second capacitor may be identical or similar, so that the process for forming the capacitor structure of the present invention is simple. Accordingly, the capacitor structure according to an embodiment of the present invention may achieve a higher capacitance in a low process cost while maintaining a good electrical property without sacrificing process window and can also avoid process complexity.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a capacitor structure, comprising:
providing a substrate having a first side and a second side opposite to the first side, wherein the substrate has an upper surface corresponding to the first side of the substrate;
forming a plurality of first trenches on the first side, the first trenches disposed along a first direction and a second direction and separated from each other on the first side of the substrate, and penetrating the substrate along a third direction intersected with the first direction and the second direction, the first direction and the second direction intersected with each other and parallel to the upper surface of the substrate;
forming a first capacitor extending along the first side and into the first trenches;
forming a plurality of second trenches on the second side, wherein the first trenches and the second trenches are non-overlapping in the third direction; and
forming a second capacitor extending along the second side and into the second trenches.

2. The method according to claim 1, wherein the first trenches and the second trenches are overlapped in the first direction.

3. The method according to claim 2, wherein the first trenches and the second trenches are separated in the third direction.

4. The method according to claim 1, wherein the first trenches and the second trenches are separated in the first direction.

5. The method according to claim 4, wherein the first trenches and the second trenches are separated in the third direction.

* * * * *